United States Patent [19]

Hayes et al.

[11] Patent Number: 5,105,277
[45] Date of Patent: Apr. 14, 1992

[54] PROCESS FOR CANCELING CELL-TO-CELL PERFORMANCE VARIATIONS IN A SENSOR ARRAY

[75] Inventors: Frederick O. Hayes, Ontario; Paul A. Hosier, Rochester, both of N.Y.

[73] Assignee: Xerox Corporation, Stamford, Conn.

[21] Appl. No.: 632,802

[22] Filed: Dec. 24, 1990

[51] Int. Cl.$^5$ ............................................. H04N 5/335
[52] U.S. Cl. ............................ 358/213.31; 358/213.27
[58] Field of Search ................... 358/213.31, 213.29, 358/213.27, 213.18, 213.16, 213.15, 213.11; 357/24 LR; 250/211 J, 208.1; 377/60-63

[56] References Cited

U.S. PATENT DOCUMENTS

| | | | |
|---|---|---|---|
| 4,274,113 | 6/1981 | Ohba et al. | 358/213.31 |
| 4,369,469 | 1/1983 | Endo et al. | 358/213.31 |
| 4,644,572 | 2/1987 | Lambert | 377/60 |
| 4,731,665 | 3/1988 | Hashimoto et al. | 358/213.27 |
| 4,737,854 | 4/1988 | Tandon et al. | 358/213.31 |
| 4,835,404 | 5/1989 | Sugawa et al. | 358/213.27 |

OTHER PUBLICATIONS

"A Low Noise CCD Input with reduced Sensitivity to Threshold Voltage"; Emmons et al; (Technical Digest of International Electron Devices Meeting); pp. 233-235; Dec. 1974.

"Charge-Coupled Devices and Systems"; endited by Howes et al.; published by John Wiley & Sons; pp. 70-72.

Primary Examiner—James J. Groody
Assistant Examiner—Glenton B. Burgess
Attorney, Agent, or Firm—Frederick E. McMullen

[57] ABSTRACT

A linear image sensor and process having a two stage transfer circuit in which split clock transistor actuating pulses are used to cancel cell-to-cell variations and neutralize undesired couplings of the rising edge of the charges into the transistors.

4 Claims, 3 Drawing Sheets

PROCESS FOR CANCELING CELL-TO-CELL PERFORMANCE VARIATIONS IN A SENSOR ARRAY

The invention relates to an image sensor array, and more particularly, to a system for improving sensor array uniformity by canceling cell-to-cell performance variations in the sensor chips due to transistor threshold mismatches and clock edge couplings.

Image sensor arrays typically comprise a linear array of photosites which raster scan an image bearing document and convert the microscopic image areas viewed by each photosite to image signal charges. Following an integration period, the image signal charges are amplified and transferred to a common output line or bus through successively actuated multiplexing transistors.

In the scanning process, bias and reset charges are applied in a predetermined time sequence during each scan cycle. Where the array employs two stage transfer circuits for transferring the image signal charges from the photosites, the bias charge is applied to each photosite through a charge injection transistor and the first transistor in the two stage transfer circuit. The reset charge is applied through a reset charge injection transistor and the second transistor of the two stage transfer circuit. However, differences in the thresholds of these transistor pairs can create non-uniformities across the array. In addition, clock edge couplings can develop on the rising edge of the bias and reset charges which can also lead to non-uniform array performance.

In the prior art, U.S. Pat. No. 4,737,854 to Tandon et al, assigned to Xerox Corporation, the assignor of the present application, discloses an image sensor array with two-stage transfer employing two transistors in series for transferring the image signal charges developed on the array photodiodes to a source follower for later transfer to a common output line by a multiplexing transistor. A publication entitled "A Low-Noise CCD Input With Reduced Sensitivity to Threshold Voltage" by Emmons et al (Technical Digest of International Electron Devices Meeting, pp. 233-235, December 1974), discloses a CCD input structure in which the injected charge is obtained from the differences between two voltage levels at a capacitive node with both levels set using the same FET structure to cancel threshold differences. "Charge-Coupled Devices and Systems", edited by M. J. Howes et al and published by John Wiley & Sons, pp. 70-72, further discusses and refers to the aforecited Emmons et al article (identified as citation #46 in the Wiley & Sons publication).

In contrast, the present invention provides a process for canceling cell-to-cell variations in image sensor chips resulting from transistor threshold mismatches and clock edge couplings in which the sensor chips have an array of sensors; a common output bus to which the image charges accumulated by the sensors during an integration period are transferred to; a two stage transistor circuit coupling each of the sensors on a chip with the output bus having first and second transistors disposed in series with one another; and an amplifier between the transistor circuit and the output bus for amplifying the image charges output by the sensors, comprising the steps of: providing a preset bias charge for application to a first node between the first and second transistors for use in setting the bias charge on the sensors; timing transfer of the bias charge to the sensors by the first transistor by applying a split clock actuating pulse to the first transistor so as to fill and spill the bias charge onto the sensors and prevent undesirable couplings of the rising edge of the bias charge into the first transistor while the first transistor is transferring the bias charge to the sensors; providing a preset reset charge for application to the first node; timing transfer of the reset charge by the second transistor to the first node by applying a second split clock actuating pulse to the second transistor so as to fill and spill the reset charge onto the first node and prevent undesirable couplings of the rising edge of the reset charge into the second transistor high level while the second transistor is setting the reset charge on the first node; continuing to provide the reset charge while inactivating the second transistor to apply the reset charge to a second node between the second transistor and the amplifier; and actuating the first and second transistors to transfer the image charges on the sensors through the first and second nodes to the amplifier for output to the bus.

The present invention further provides a sensor array with improved uniformity and reduced cell-to-cell variations resulting from transistor threshold mismatches and clock edge couplings, comprising the combination of: an array of sensors; a common output bus to which the image charges accumulated by the sensors during an integration period are transferred to; a two stage transistor circuit coupling each of the sensors on a chip with the output bus, the transistor circuit having first and second transistors disposed in series with one another; amplifier means between the transistor circuit and the output bus for amplifying the image charges output by the sensors; means providing a preset bias charge for application for use in setting the bias charge on the sensors; means providing a preset reset charge for resetting the input to the amplifier means; and timing control means for providing bias charge transferring split clock pulses to the first transistor whereby to repeatedly actuate the first transistor and thereby fill and spill the bias charge from the bias charge means onto the sensors, the bias charge transferring split clock pulses preventing undesirable couplings of the rising edge of the bias charge into the first transistor while the first transistor is transferring the bias charge to the sensors; the timing control means providing reset charge transferring split clock pulses to the second transistor whereby to repeatedly actuate the second transistor and thereby fill and spill the reset charge from the reset charge means onto the first node, the reset charge transferring split clock pulses preventing undesirable couplings of the rising edge of the reset charge into the second transistor high level while the second transistor is setting the reset charge on the first node; the timing means following transfer of the reset charge to the first node inactivating the second transistor while applying the reset charge to a second node between the second transistor and the amplifier whereby to ready the sensors for transfer of the image charges accumulated on the sensors to the amplifier means.

IN THE DRAWINGS

Figure 1:
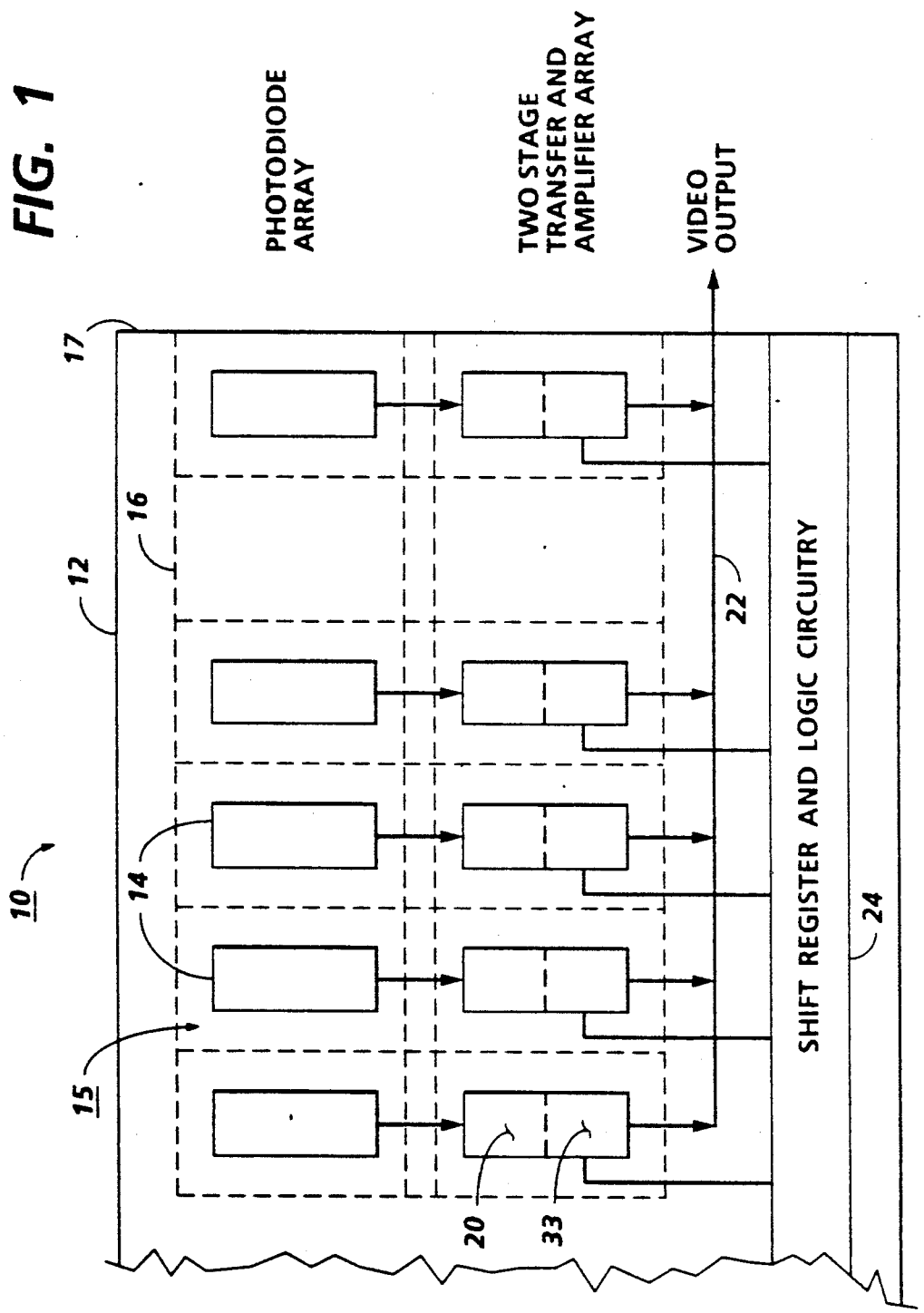
FIG. 1 is a schematic view of an image scanning array having an array of photosite cells, each cell having a photodiode with two stage transfer circuit for transferring image signal charges from the photodiodes to a common output bus and incorporating the uniformity enhancing features of the present invention.

Referring to FIG. 1, there is shown the image sensor array with two stage transfer, designated generally by the numeral 10, of the type to which the present invention is directed. Image sensor array 10 includes a base or chip 12 of silicon with a plurality of photosites in the form of photodiodes 14 thereon. Photodiodes 14 are in closely spaced juxtaposition with one another on chip 12 in a linear array or row 16. Several smaller arrays such as array 10 can be abutted together end to end with one another to form a longer array, i.e. a full width or contact array, with spacing between the photodiodes at the butted ends the same as the spacing between the photodiodes inside the chip thereby maintaining photodiode pitch across the entire full width of the composite array.

While photodiodes 14 are shown and described herein, other photosite types such as amorphous silicon or transparent electrode MOS type photosites may be envisioned. Further, while a one dimensional sensor array having a single row 16 of photodiodes 14 is shown and described herein, a two dimensional sensor array with plural rows of photodiodes may be contemplated.

Each photodiode 14 has a two stage transfer circuit 20 associated therewith which together with the photodiode and an amplifier 33 form a photosite cell 15 at the array front end. In each cell 15, the image charge signal from the photodiode is transferred by circuit 20 to amplifier 33 where the image signal charge from photodiode 14 is amplified to bring the image charge signal to a desired potential level prior to transferring the charge to a common video output line or bus 22. Suitable shift register and logic circuitry 24 provide timing control signals $\Phi_{PIXEL}$ for connecting each pixel cell 15 to bus 22 in the proper timed sequence.

Image sensor array 10 may, for example, be used to raster scan a document original, and in that application, the document original and the sensor array 10 are moved or stepped relative to one another in a direction (i.e., the slow scan direction) that is normally perpendicular to the linear axis of array 10. At the same time, the array scans the document original line by line in the direction (i.e., the fast scan direction) parallel to the linear axis of the array. The image line being scanned is illuminated and focused onto the photodiodes 14. During an integration period, a charge is developed on each photodiode proportional to the reflectance of the image area viewed by each photodiode. The image signal charges are thereafter transferred by two stage transfer circuits 20 via amplifier 33 to output bus 22 in a predetermined step by step timed sequence.

Non-uniformities in the transfer circuits may, however, occur as a result of clock couplings and mismatches between the second stage transistor thresholds. To enhance uniformity, the present invention uses a 'fill and spill' techinque through the same transistors used to transfer signal charges to cancel substantially all cell-to-cell performance variations of the sensor array chips resulting from transistor threshold mismatches. Additionally, split timing pulses are used to effectively eliminate clock edge couplings that may otherwise cause non-uniformities.

In the ensuing description, all transistors shown are N-channel type. However, P-channel transistors may instead be used with appropriate voltage level changes as will be understood.

Figure 2:
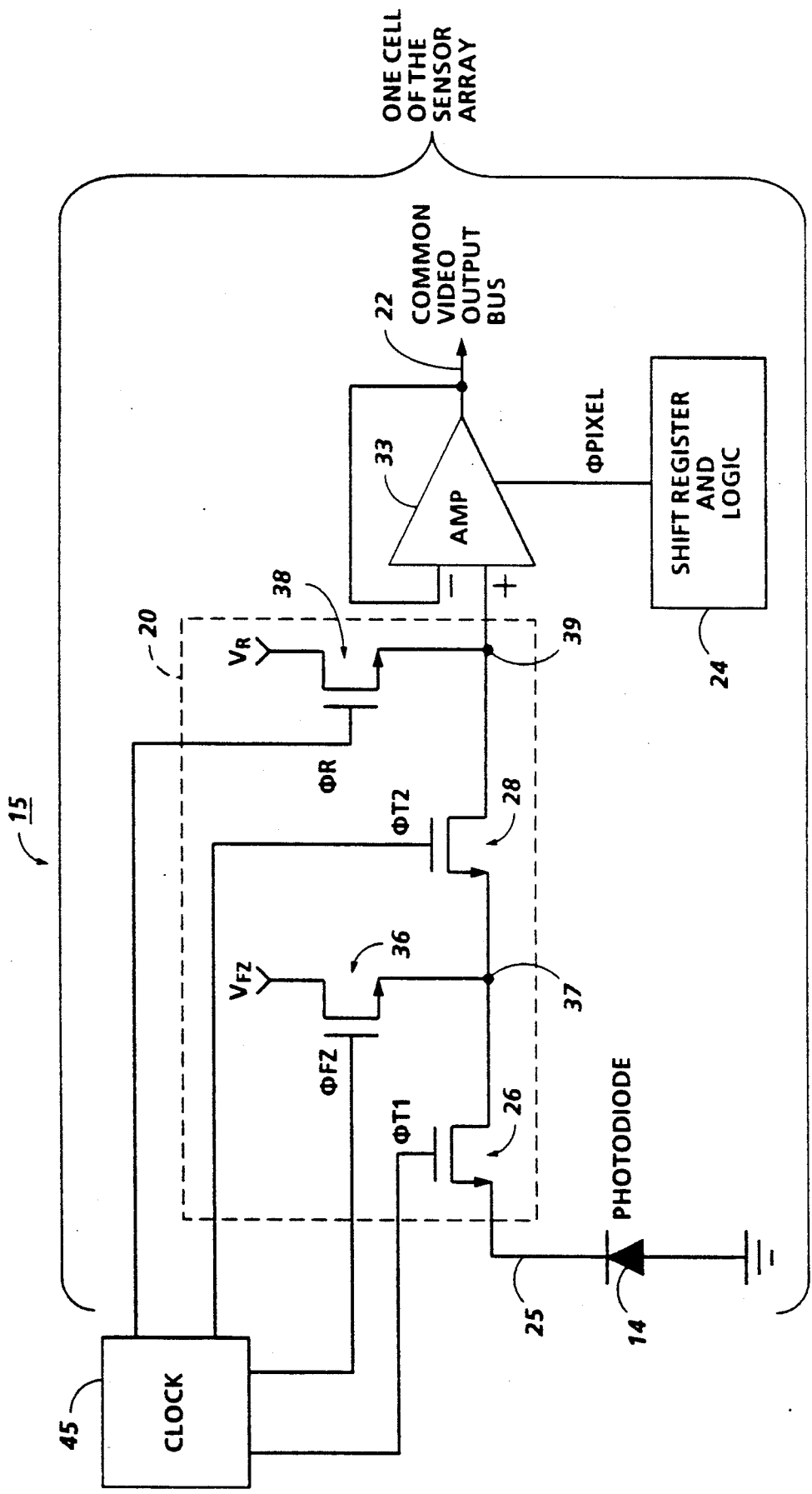
FIG. 2 is a circuit schematic showing details of the improved transfer circuit of the present invention adapted to cancel cell-to-cell variations in the array that result from transistor threshold mismatches and clock edge couplings with attendant improvement in uniformity.

Referring particularly to FIG. 2, the two stage transfer circuit 20 of each cell 15 has first and second stage transfer transistors 26, 28 for transferring the image signal charge from the photodiode 14 to amplifier 33. Transistors 26, 28 are in series with line 25 connecting one electrode of photodiode 14 with the input gate of amplifier 33. The other electrode of photodiode 14 is grounded.

A bias charge injection transistor 36 is provided to inject a preset bias charge, for example, an electrical fat zero $V_{FZ}$, to line 25 at middle node 37. A reset charge injection transistor 38 controls injection of a reset signal from a predetermined reset signal source $V_R$ to line 25 at the node 39 at the input to amplifier 33.

A suitable clock generator 45 provides clock signals $\Phi_{T1}$ and $\Phi_{FZ}$ for timing injection of the preset bias charge $V_{FZ}$ into line 25 and clock signals $\Phi_{T2}$ and $\Phi_R$ for timing injection of the reset signal $V_R$ to line 25 at node 39. The $\Phi_{PIXEL}$ signals for multiplexing the amplified charge output by amplifier 33 onto the common video output bus 22 are provided by shift register and logic circuitry 24.

OPERATION

Figure 3:
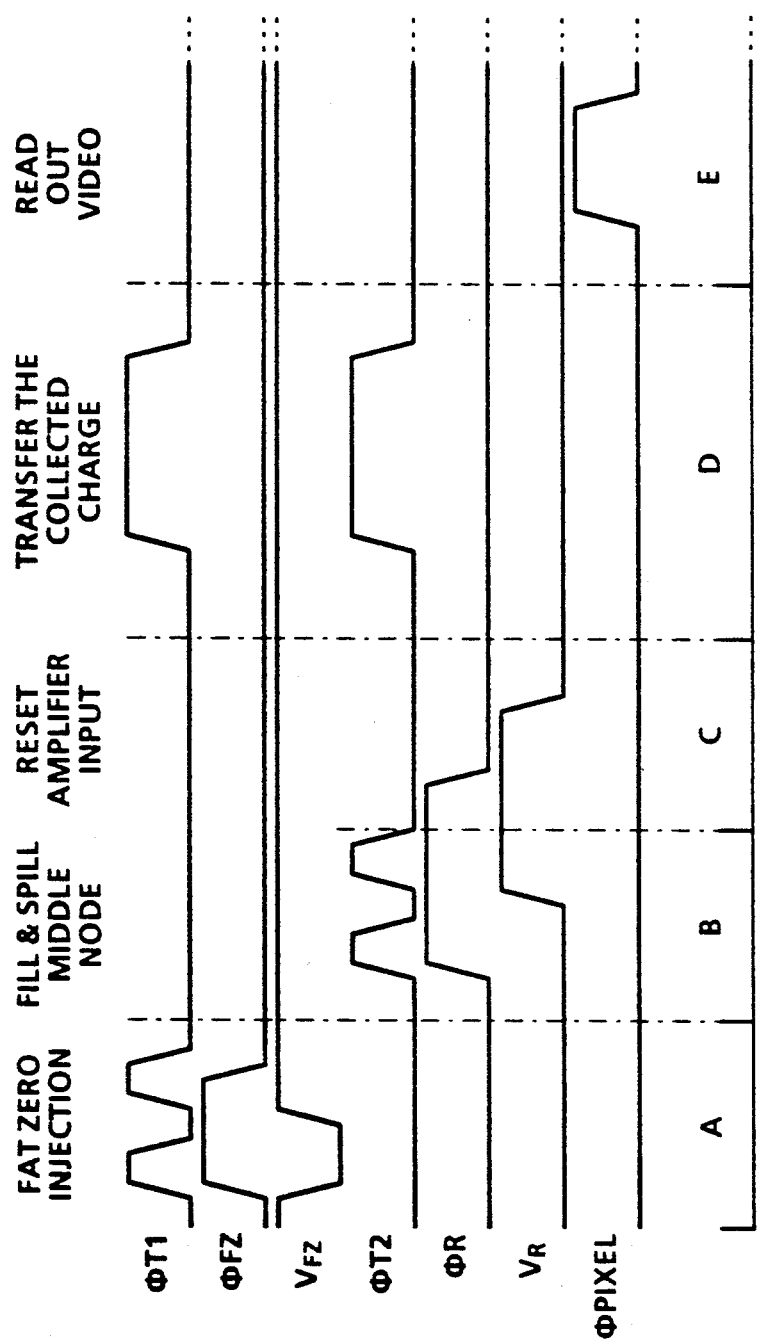
FIG. 3 is a timing diagram showing the operating clock signal waveform for the image scanning array shown in FIG. 1.

In operation and referring particularly to FIGS. 2 and 3, following the integration period, a lateral charge transfer cycle for all photodiodes 14 is initiated to transfer the charges accumulated on photodiodes 14 to bus 22. During the time A, clock signals $\Phi_{T1}$ and $\Phi_{FZ}$ actuate first stage transistor 26 and bias charge injection transistor 36 to inject the fat zero bias charge $V_{FZ}$ to line 25 at middle node 37. As shown in FIG. 3, clock pulse $\Phi_{T1}$ is split to provide two $\Phi_{T1}$ pulses which results in a 'fill and spill' charge injection process. As a result, a bias charge according to the level of the second $\Phi_{T1}$ pulse during the 'spill' period is obtained. The split clock pulse $\Phi_{T1}$ prevents couplings and variations of couplings across the array that can occur on the rising edge of the bias charge $V_{FZ}$ which is setting the bias charge on the photodiodes. Following transfer of the bias charge, first stage transistor 26 and charge injection transistor 36 are inactivated.

During the time B, clock pulses $\Phi_{T2}$ and $\Phi_R$ actuate second stage transistor 28 and reset charge injection transistor 38 respectively, causing the charge $V_R$ to be injected onto the middle node 37. The clock pulses $\Phi_{T2}$ are split to 'fill and spill' the reset charge onto node 37 in accordance with the high level of the second $\Phi_{T2}$ pulse. This step eliminates variations in the amount of charge transferred from middle node 37 due to transistor 28, 36 threshold mismatches across the array. The purpose of splitting the $\Phi_{T2}$ pulse is to prevent couplings and variations of couplings across the array that may occur on the rising edge of the reset charge $V_R$ which is setting the charge on middle node 37.

During time C, reset transistor 38 is maintained in an 'on' state (second stage transistor 28 is inactivated) so that node 39 at the input of amplifier 33 is reset to the high level of the reset charge $V_R$. Since $\Phi_R$ is fully turned on, node 39 is transistor threshold independent. Following transfer of the reset charge to node 39, reset transistor 38 is inactivated.

During time D, first and second stage transistors 26, 28 are actuated by pulses $\Phi_{T1}$ and $\Phi_{T2}$ respectively to transfer the charge on photodiode 14 to amplifier 33. This allows the charge to be transferred through the same transistors 26, 28 used to place the bias charge on both photosite 14 and middle node 37. As a result, transistor threshold variations across the array are canceled.

During time E, the amplified charge from each pixel cell 20 is multiplexed onto common video bus 22 by the $\Phi_{PIXEL}$ signal input to amplifier 33.

While the invention has been described with reference to the structure disclosed, it is not confined to the details set forth, but is intended to cover such modifications or changes as may come within the scope of the following claims.

We claim:

1. A process for canceling cell-to-cell variations in image sensor chips resulting from transistor threshold mismatches and clock edge couplings in which said sensor chips have an array of sensors; a common output bus to which the image charges accumulated by said sensors during an integration period are transferred to; a two stage transistor circuit coupling each of said sensors on a chip with said output bus having first transistor and second transistor disposed in series with one another; and an amplifier between said transistor circuit and said output bus for amplifying the image charges output by said sensors, comprising the steps of:
   a) providing a preset bias charge for application to a first node between said first and second transistors for use in setting the bias charge on said sensors;
   b) timing transfer of said bias charge to said sensors by said first transistor by applying a split clock actuating pulse to said first transistor so as to fill and spill said bias charge onto said sensors and prevent undesirable couplings of the rising edge of said bias charge into said first transistor while said first transistor is transferring said bias charge to said sensors;
   c) providing a preset reset charge for application to said first node;
   d) timing transfer of said reset charge by said second transistor to said first node by applying a second split clock actuating pulse to said second transistor so as to fill and spill said reset charge onto said first node and prevent undesirable couplings of the rising edge of said reset charge into said second transistor high level while said second transistor is setting said reset charge on said first node;
   e) continuing to provide said reset charge while inactivating said second transistor to apply said reset charge to a second node between said second transistor and said amplifier; and
   f) actuating said first and second transistors to transfer the image charges on said sensors through said first and second nodes to said amplifier for output to said bus.

2. The process according to claim 1 in which said transistor circuit includes a third transistor adapted on actuation to input said bias charge, including the step of:
   timing input of said bias charge by said third transistor by applying a clock actuation pulse to said third transistor substantially simultaneously with said split clock actuation pulse to said first transistor.

3. The process according to claim 1 in which said transistor circuit includes a third transistor adapted on actuation to input said reset charge, including the step of:
   timing input of said reset charge by said third transistor by applying a clock actuation pulse to said third transistor substantially simultaneously with said split clock actuation pulse to said second transistor.

4. The process according to claim 1 in which said transistor circuit includes a third transistor adapted on actuation to input said bias charge and a fourth transistor adapted on actuation to input said reset charge, including the steps of:
   timing input of said bias charge by said third transistor by applying a clock actuation pulse to said third transistor substantially simultaneously with said split clock actuation pulse to said first transistor; and
   timing input of said reset charge by said fourth transistor by applying a clock actuation pulse to said fourth transistor substantially simultaneously with said split clock actuation pulse to said second transistor.

* * * * *